United States Patent
Kim et al.

(10) Patent No.: US 10,868,268 B2
(45) Date of Patent: Dec. 15, 2020

(54) MANUFACTURING METHOD OF ORGANIC LIGHT-EMITTING DISPLAY AND MASK ASSEMBLY

(71) Applicant: SAMSUNG DISPLAY CO., LTD., Yongin-si (KR)

(72) Inventors: Hoon Kim, Yongin-si (KR); Keehyun Nam, Yongin-si (KR); Junwoo Kim, Yongin-si (KR); Hyesuk An, Yongin-si (KR); Gyunghyun Ko, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/425,247

(22) Filed: May 29, 2019

(65) Prior Publication Data
US 2020/0144530 A1   May 7, 2020

(30) Foreign Application Priority Data

Nov. 2, 2018 (KR) .................. 10-2018-0133907

(51) Int. Cl.
| | |
|---|---|
| *H01L 51/50* | (2006.01) |
| *H01L 27/12* | (2006.01) |
| *H01L 21/02* | (2006.01) |
| *H01L 51/52* | (2006.01) |

(52) U.S. Cl.
CPC ...... *H01L 51/5056* (2013.01); *H01L 21/0226* (2013.01); *H01L 27/1218* (2013.01); *H01L 51/5072* (2013.01); *H01L 51/5092* (2013.01); *H01L 51/5203* (2013.01)

(58) Field of Classification Search
CPC ............. H01L 51/5056; H01L 51/5072; H01L 51/5203; H01L 21/0226; H01L 21/1218
See application file for complete search history.

(56) References Cited

U.S. PATENT DOCUMENTS

| | | | |
|---|---|---|---|
| 9,143,668 B2 | 9/2015 | Mathew et al. | |
| 2004/0212555 A1 | 10/2004 | Falco | |
| 2017/0287992 A1 | 10/2017 | Kwak et al. | |
| 2018/0040857 A1 | 2/2018 | Hong et al. | |
| 2018/0157362 A1 | 6/2018 | Kim et al. | |
| 2019/0093216 A1* | 3/2019 | Zhou .................. | H01L 51/56 |

FOREIGN PATENT DOCUMENTS

| | | |
|---|---|---|
| KR | 10-2017-0111827 A | 10/2017 |
| KR | 10-2018-0017301 A | 2/2018 |

* cited by examiner

*Primary Examiner* — Armando Rodriguez
(74) *Attorney, Agent, or Firm* — Kile Park Reed & Houtteman PLLC

(57) ABSTRACT

A method of manufacturing a display device includes preparing a pixel circuit substrate including thin-film transistors and pixel electrodes respectively electrically connected to the thin-film transistors, forming a first deposition layer on the pixel circuit substrate using a first mask assembly, and forming a second deposition layer on the pixel circuit substrate using a second mask assembly. At least one of the first mask assembly and the second mask assembly includes a mask plate including an opening portion through which a deposition material passes and a covering portion that blocks a passage of the deposition material. The mask plate includes a protruding portion that protrudes from an edge of the covering portion toward a center region of the opening portion.

20 Claims, 13 Drawing Sheets

MANUFACTURING METHOD OF ORGANIC LIGHT-EMITTING DISPLAY AND MASK ASSEMBLY

CROSS-REFERENCE TO RELATED APPLICATION

Korean Patent Application No. 10-2018-0133907, filed on Nov. 2, 2018, in the Korean Intellectual Property Office, and entitled: "Manufacturing Method of Organic Light-Emitting Display and Mask Assembly," is incorporated by reference herein in its entirety.

BACKGROUND

1. Field

Embodiments relate to a manufacturing method of an organic light-emitting display and a mask assembly therefor.

2. Description of the Related Art

The usage of display devices is diversifying, the thickness and the weight of the display devices are decreasing, and the range of use thereof is widening.

Various functions for connecting or linking to display devices have been added while the area occupied by a display area in such display devices has increased. In addition, ways of adding various functions while enlarging the area are being considered.

SUMMARY

Embodiments are directed to a method of manufacturing a display device, including preparing a pixel circuit substrate including thin-film transistors and pixel electrodes respectively electrically connected to the thin-film transistors, forming a first deposition layer on the pixel circuit substrate using a first mask assembly, and forming a second deposition layer on the pixel circuit substrate using a second mask assembly. At least one of the first mask assembly and the second mask assembly includes a mask plate including an opening portion through which a deposition material passes and a covering portion that blocks a passage of the deposition material. The mask plate includes a protruding portion that protrudes from an edge of the covering portion toward a center region of the opening portion.

The first mask assembly may include a mask sheet including a plurality of holes spaced apart from each other. The mask plate of the first mask assembly may partially cover a first hole among the plurality of holes.

The mask plate of the first mask assembly may overlap the mask sheet and may be arranged in a direction intersecting an extending direction of the mask sheet.

The first deposition layer may include emission layers spaced apart from each other. A shape of each of first emission layers among the emission layers formed on the pixel circuit substrate may be different from a shape of each of second emission layers among the emission layers.

The organic light-emitting display device may include a transmissive area through which light or sound is transmitted, a display area that partially surrounds the transmissive area, and a non-display area between the transmissive area and the display area. The first emission layers may correspond to the display area, and the second emission layers may correspond to the non-display area.

The first deposition layer may include emission layers spaced apart from each other. An area of each of first emission layers among the emission layers formed on the pixel circuit substrate may be greater than an area of each of second emission layers among the emission layers.

The mask plate of the second mask assembly may include an opening portion having a closed loop edge. An edge of the protruding portion may correspond to a portion of the closed loop edge.

The second deposition layer may include at least one of a hole transport layer, a hole injection layer, an electron transport layer, an electron injection layer, and an opposite electrode having a polarity different from that of the pixel electrodes. A thickness of a first portion of the second deposition layer formed on the pixel circuit substrate may be greater than a thickness of a second portion of the second deposition layer.

The organic light-emitting display device may include a transmissive area through which light or sound is transmitted, a display area that partially surrounds the transmissive area, and a non-display area between the transmissive area and the display area. The first portion of the second deposition layer may correspond to the display area. The second portion of the second deposition layer may correspond to the non-display area.

The second deposition layer may not be on the transmissive area.

Embodiments are also directed to a mask assembly including a mask plate including an opening portion through which a deposition material passes, a covering portion that blocks a passage of the deposition material, and a protruding portion protruding from an edge of the covering portion toward a center region of the opening portion.

The opening portion of the mask assembly may include a closed loop edge. An edge of the protruding portion may correspond to a portion of the closed loop edge.

The edge of the protruding portion may include a linear region. The protruding portion may protrude from the linear region.

The edge of the protruding portion may include a curved area. The protruding portion may protrude from the curved area.

The covering portion and the protruding portion may be integrally formed.

The mask assembly may further include a mask sheet overlapping the mask plate, the mask sheet including a plurality of holes spaced apart from each other.

The protruding portion of the mask plate may partially cover the holes of the mask sheet.

The protruding portion of the mask plate may partially cover a first hole among the holes of the mask sheet.

The mask sheet and the mask plate may overlap each other while contacting each other.

The mask sheet and the mask plate may be made of different materials.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
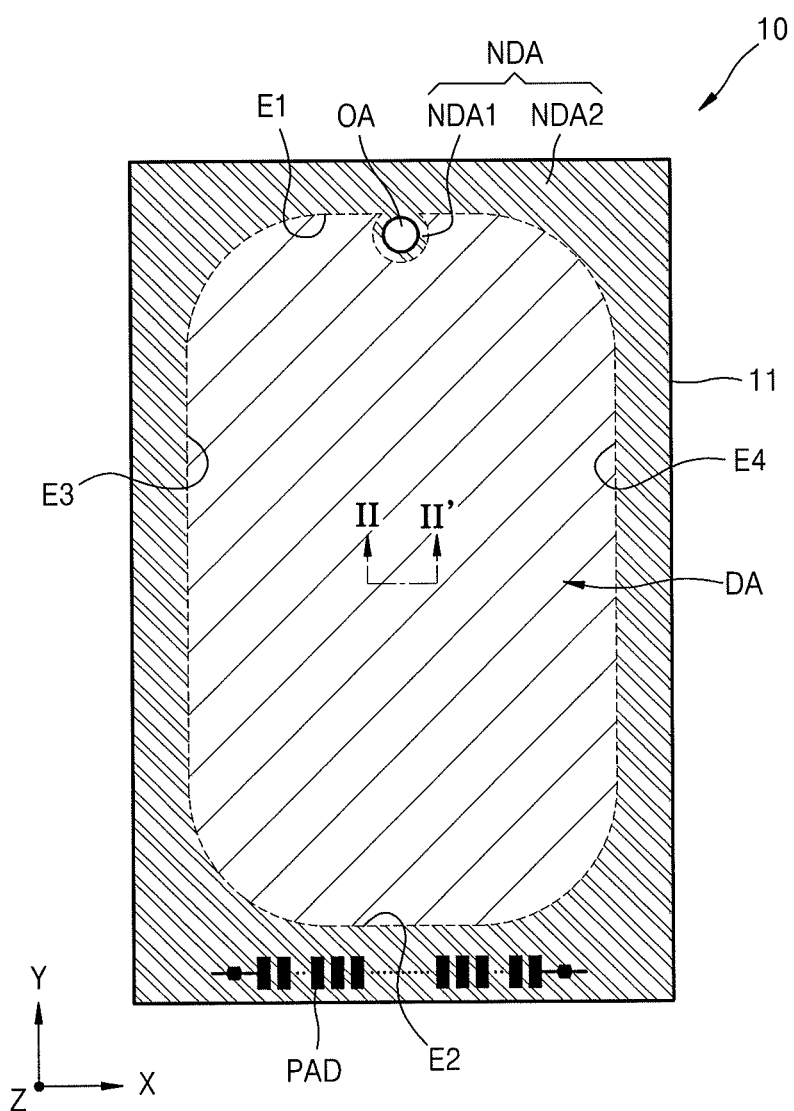
FIG. 1 illustrates a plan view of a display device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the term "and/or" includes any and all combinations of one or more of the associated listed items. Throughout the disclosure, the expression "at least one of a, b and c" indicates only a, only b, only c, both a and b, both a and c, both b and c, all of a, b, and c, or variations thereof.

It will be understood that although the terms "first", "second", etc. may be used herein to describe various components, these components should not be limited by these terms. These components are only used to distinguish one component from another.

An expression used in the singular encompasses the expression of the plural, unless it has a clearly different meaning in the context.

When a certain embodiment may be implemented differently, a specific process order may be performed differently from the described order. For example, two consecutively described processes may be performed substantially at the same time or performed in an order opposite to the described order.

FIG. 1 illustrates a plan view of a display device 10 according to an embodiment.

Referring to FIG. 1, the display device 10 may include a display area DA for emitting light. The transmissive area OA may be arranged in the display area DA. The transmissive area OA may contact a first edge E1 of the display area DA, and the transmissive area OA may be partially surrounded by the display area DA. In this regard, FIG. 1 discloses a structure in which a remaining portion, except an upper portion, of the transmissive area OA is surrounded by the display area DA.

The transmissive area OA may be an area through which light or sound passes. A component for improving the display device 10 or for adding a new function may be located in the transmissive area OA. The component may include, for example, a camera that captures an image, or an electronic component such as an optical sensor capable of recognizing distances or fingerprints. In some implementations, the component may be a speaker that outputs sound. As an embodiment, the display device 10 may include an opening corresponding to the transmissive area OA.

A first non-display area NDA1 may be located between the transmissive area OA and the display area DA. The first non-display area NDA1 may surround the transmissive area OA as a whole. A second non-display area NDA2 may surround the display area DA as a whole. The first non-display area NDA1 may be connected to the second non-display area NDA2.

FIG. 1 shows that the transmissive area OA is arranged adjacent to the first edge E1 of the display area DA opposite a pad portion PAD. In some implementations, the transmissive area OA may be located adjacent to a second edge E2 of the display area DA opposite the first edge E1, or may be located adjacent to a third edge E3 or a fourth edge E4 that is perpendicular to the first edge E1. In some implementations, the transmissive area OA may be at a corner of the display area DA, for example, at a corner between adjacent edges.

Figure 2:
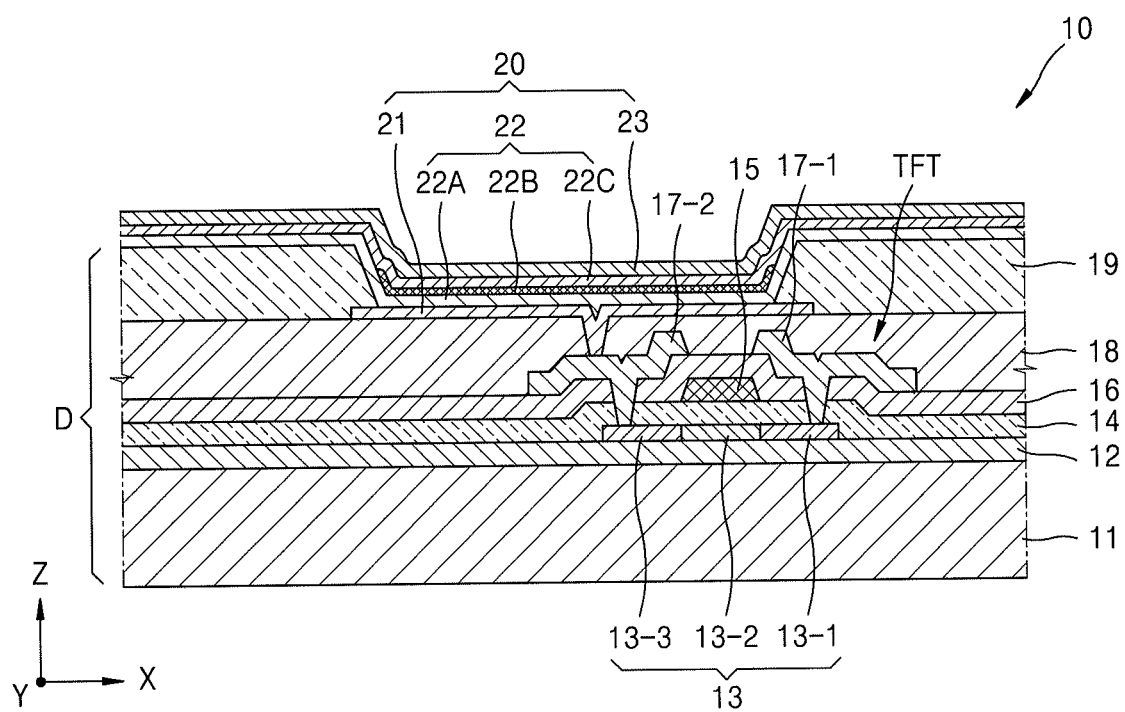
FIG. 2 illustrates a cross-sectional view of a pixel of a display device according to an embodiment.

FIG. 2 illustrates a cross-sectional view of a pixel of a display device, taken along line II-II' of FIG. 1, according to an embodiment.

Referring to FIG. 2, the display device 10 may include a pixel circuit substrate D and an intermediate layer 22 and an opposite electrode 23 on the pixel circuit substrate D. The pixel circuit substrate D may include a pixel circuit including a thin-film transistor TFT and a pixel electrode 21 electrically connected to the pixel circuit. The pixel electrode 21, the intermediate layer 22 and the opposite electrode 23 may form an organic light-emitting diode 20 that emits light of a certain color. A sealing member may be on the opposite electrode 23. The sealing member may include a thin-film sealing layer including at least one inorganic encapsulation layer and at least one organic sealing layer. In some implementations, the sealing member may include a sealing substrate facing a substrate 11, and a sealing member interposed between the sealing substrate and the substrate 11. The sealing member may surround the display area DA in the second non-display area NDA2 and/or the first non-display area NDA1.

The pixel circuit substrate D may include the substrate 11, the thin-film transistor TFT, and the pixel electrode 21. The substrate 11 may include a polymer resin or a glass material. For example, the substrate 11 may include a glass material containing silicon oxide ($SiO_2$) as a main component, or a resin such as a reinforced plastic. In some implementations, the substrate 11 may be a multi-layer structure including a base layer including a polymer resin such as polyimide and a barrier layer such as silicon nitride or silicon oxide.

A buffer layer 12 such as silicon nitride, silicon oxynitride, or silicon oxide layer may be on the substrate 11. A semiconductor layer 13 may be on the buffer layer 12. The semiconductor layer 13 may include an inorganic semiconductor material such as amorphous silicon or crystalline silicon. In some implementations, the semiconductor layer 13 may include an oxide semiconductor or an organic semiconductor material.

A gate electrode 15 may be on the semiconductor layer 13. A gate insulating layer 14 including an inorganic material, for example, silicon oxynitride, silicon oxide, and/or silicon nitride may be between the gate electrode 15 and the semiconductor layer 13.

The semiconductor layer 13 may include a channel region 13-2 overlapping the gate electrode 15 and a source region 13-1 and a drain region 13-3 located on both sides of the channel region 13-2. The source region 13-1 and the drain region 13-3 may be respectively connected to a source electrode 17-1 and a drain electrode 17-2. The source electrode 17-1 and the drain electrode 17-2 may be on a interlayer insulating layer 16. The interlayer insulating layer 16 may include an inorganic material such as silicon oxynitride, silicon oxide, and/or silicon nitride.

The source electrode 17-1 and the drain electrode 17-2 may be respectively connected to the source region 13-1 and the drain region 13-3 through a contact hole passing through the interlayer insulating layer 16 and the gate insulating layer 14.

The thin film transistor TFT including the semiconductor layer 13, the gate electrode 15, and the source electrode 17-1 and the drain electrode 17-2 may be covered with a planarization insulating layer 18. The planarization insulating layer 18 may include an organic material such as polyimide.

The pixel electrode 21 is on the planarization insulating layer 18 and may be connected to the thin-film transistor TFT through the contact hole of the planarization insulating layer 18. The pixel electrode 21 may be a reflective layer including silver (Ag), magnesium (Mg), aluminum (Al), platinum (Pt), palladium (Pd), gold (Au), nickel (Ni), neodymium (Nd), iridium (Ir), chromium (Cr), or the like. The pixel electrode 21 may further include a transparent conductive layer such as indium tin oxide (ITO) arranged above and below the reflective layer.

The pixel-defining layer 19 may be on the pixel electrode 21. The pixel-defining layer 19 may have a through hole exposing the center region of the pixel electrode 21. The pixel-defining layer 19 may increase a distance between an edge of the pixel electrode 21 and the opposite electrode 23, thereby reducing or preventing the generation of an arc or the like therebetween. The pixel-defining layer 19 may include an organic material such as polyimide or hexamethyldisiloxane (HMDSO).

The intermediate layer 22 may include a low molecular material or a polymer material. The intermediate layer 22 may include an emission layer 22B. The emission layer 22B may include a polymer material or a low molecular material that emits light of a certain color. A first common layer 22A and a second common layer 22C may be located above and below the emission layer 22B.

The first common layer 22A may be a single layer or multiple layers. For example, when the first common layer 22A includes a polymer material, the first common layer 22A may be a hole transport layer (HTL) having a single-layer structure and may include 3, 4-ethylene-dihydroxy-thiophene (PEDOT) or polyaniline (PANI). When the first common layer 22A includes a low molecular material, the first common layer 22A may include a hole injection layer (HIL) and a hole transport layer (HTL).

The second common layer 22C is optional. When the first common layer 22A and the emission layer 22B include a polymer material, it may be desirable to form the second common layer 22C. The second common layer 22C may be a single layer or multiple layers. The second common layer 22C may include an electron transport layer (ETL) and/or an electron injection layer (EIL).

The emission layer 22B in the intermediate layer 22 may be arranged for each pixel in the display area DA. The emission layer 22B may overlap with an upper surface of the pixel electrode 21 exposed through an opening of the pixel-defining layer 19. The first and second common layers 22A and 22C of the intermediate layer 22 may be formed as a single body so as to cover the display area DA (of FIG. 1), respectively.

The opposite electrode 23 may include a conductive material having a low work function. For example, the opposite electrode 21 may include a (semi) transparent electrode including Ag, Mg, Al, Pt, Pd, Au, Ni, Nd, Ir, Cr, or an alloy thereof. In some implementations, the opposite electrode 23 may further include a layer such as ITO, indium zinc oxide (IZO), zinc oxide (ZnO), or indium oxide ($In_2O_3$) on the (semi) transparent layer including the above-mentioned material. The opposite electrode 23 may be formed as a single body so as to cover the display area DA (of FIG. 1).

In a manufacturing process of the display device 10, the intermediate layer 22 and the opposite electrode 23 may be formed through a deposition process. The pixel circuit substrate D may be arranged in a chamber for deposition in which the intermediate layer 22 and the opposite electrode 23 are formed. The pixel circuit substrate D including layers extending from the substrate 11 to the pixel-defining layer 19 may be formed through a separate process and then moved to the chamber for deposition.

Figure 3:
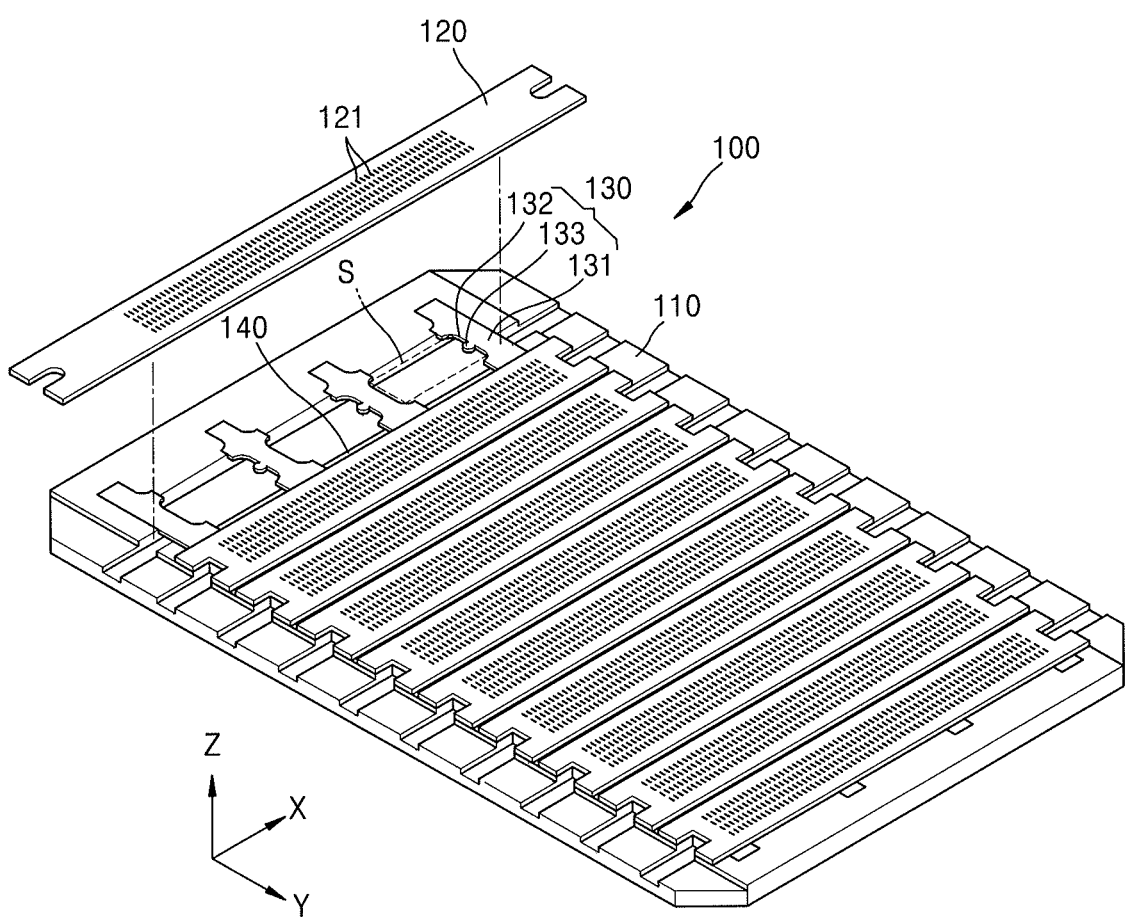
FIG. 3 illustrates a perspective view of a first mask assembly for forming a first deposition layer of a display device according to an embodiment.
Figure 4A:
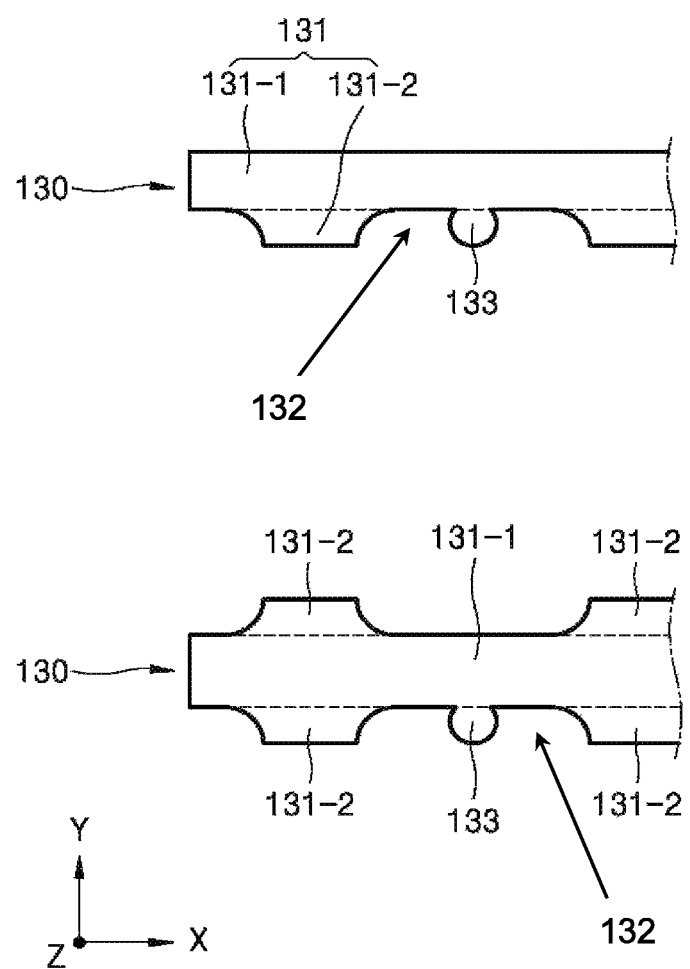
FIG. 4A illustrates a plan view of a mask plate of a first mask assembly according to an embodiment.
Figure 4B:
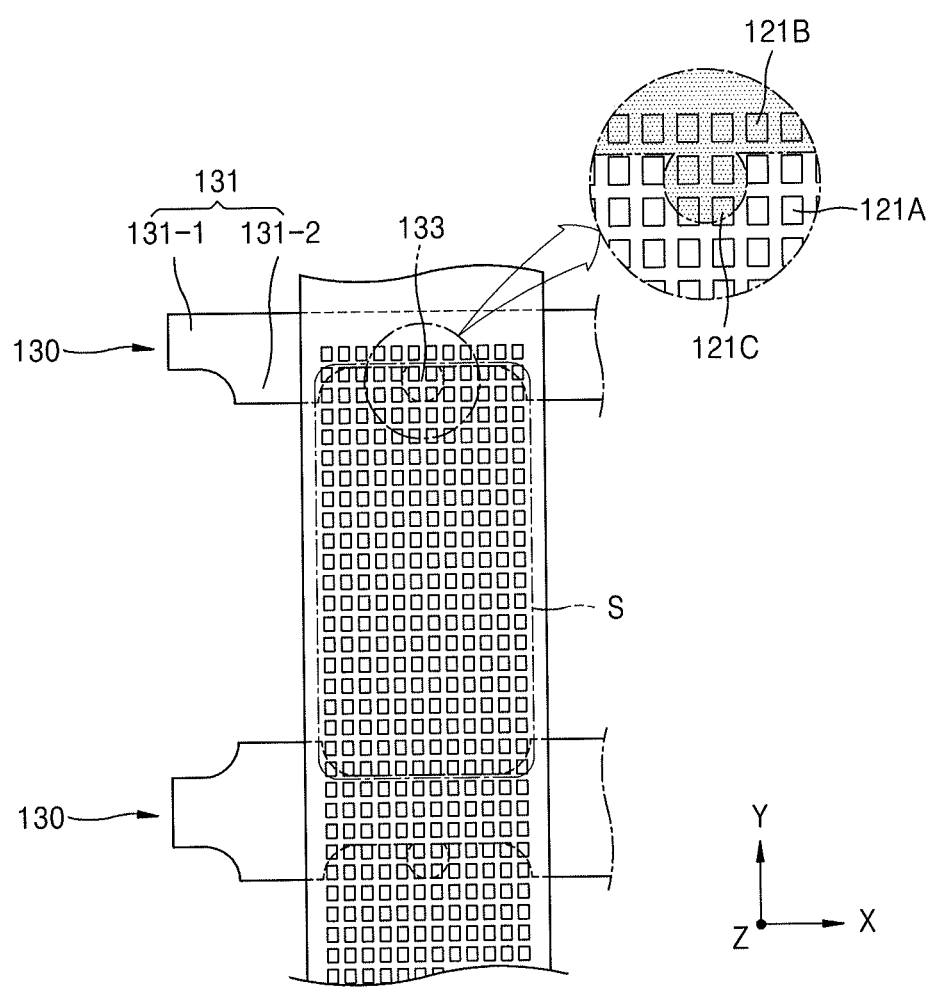
FIG. 4B illustrates a plan view of a state in which a mask plate and a mask sheet of the first mask assembly of FIG. 4A overlap each other.
Figure 4C:
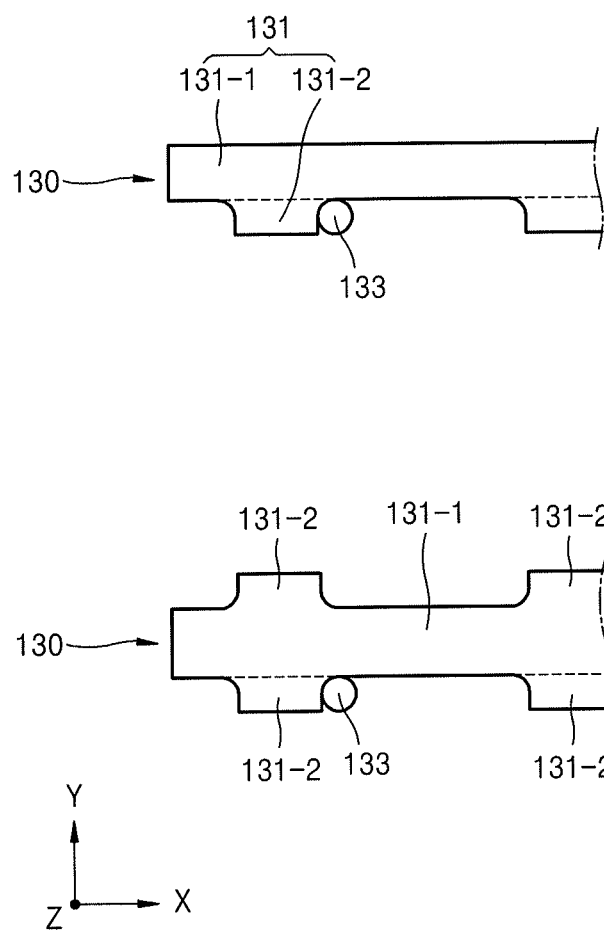
FIG. 4C illustrates a plan view of a mask plate of a first mask assembly according to another embodiment.
Figure 4D:
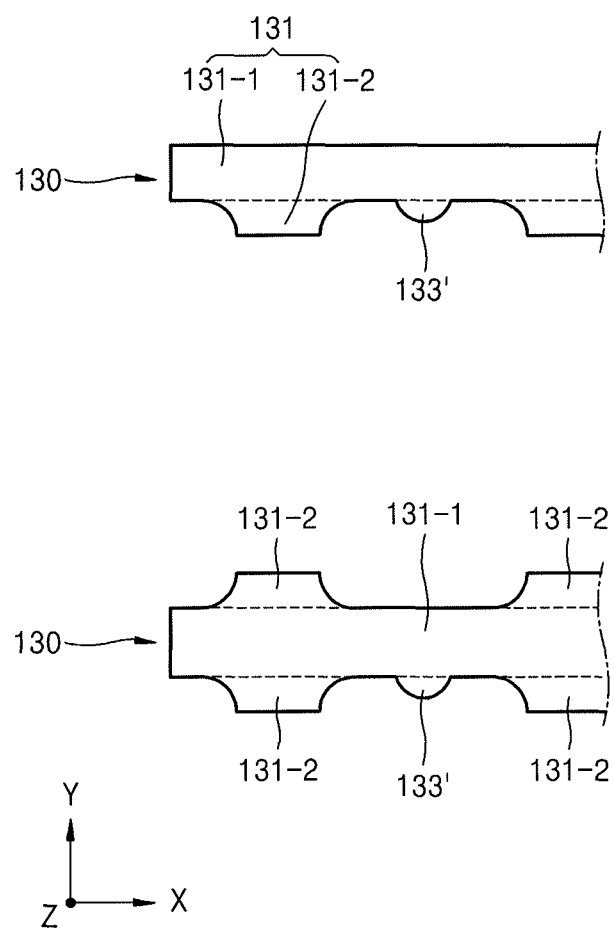
FIG. 4D illustrates a plan view of a mask plate of a first mask assembly according to another embodiment.

FIG. 3 illustrates a perspective view of a first mask assembly for forming a first deposition layer of a display device according to an embodiment, FIG. 4A illustrates a plan view of a mask plate of a first mask assembly according to an embodiment, FIG. 4B illustrates a plan view of a state in which a mask plate and a mask sheet of the first mask assembly of FIG. 4A overlap each other, FIG. 4C illustrates a plan view of a mask plate of a first mask assembly according to another embodiment, and FIG. 4D illustrates a plan view of a mask plate of a first mask assembly according to another embodiment.

Referring to FIG. 3, a first mask assembly 100 may include a plurality of mask sheets 120. The mask sheets 120 may be arranged in one direction. For example, FIG. 3 shows that the mask sheets 120 are arranged in a Y direction.

The mask sheets 120 may include a plurality of holes 121. The holes 121 may be spaced apart from each other by a certain distance. The arrangement of the holes 121 may be substantially the same as the arrangement of pixels, for example, light-emitting regions, of the display device 10 described with reference to FIG. 1.

The mask sheets 120 may be on a mask frame 110. Both ends of a mask sheet 120 in the X direction may be supported by the mask frame 110. Both sides of the mask sheet 120 in the Y direction may be supported by a support frame 140 coupled to the mask frame 110 to prevent sagging of each mask sheet 120 due to gravity.

The support frame 140 may extend in the same direction as the mask sheet 120, for example, in an X direction of FIG. 3. The support frame 140 may support both sides of the mask sheet 120 without covering the holes 121 of the mask sheet 120.

Both ends of the support frame 140 may be coupled to the mask frame 110 by being inserted into the mask frame 110 or the like. The support frame 140 may be between adjacent mask sheets 120 and may support both sides of the mask sheets 120 as described above.

Mask plates 130 may be arranged in a direction intersecting the mask sheets 120. For example, the mask plates 130 may be arranged in the X direction of FIG. 3, which is a direction intersecting the direction of arrangement of the mask sheets 120.

The mask plates 130 may be installed in the mask frame 110. Both ends of each of the mask plates 130 in the Y direction may be respectively supported by the mask frame 110. The mask frame 110 may include a groove that accommodates the end of the mask plate 130.

The mask sheet 120 and a mask plate 130 may include different materials. For example, the mask plate 130 may include austenitic stainless steel and the mask sheet 120 may include a nickel-iron alloy (for example, Invar).

A space S between adjacent mask plates 130 overlapping with one mask sheet 120 may be an opening portion through which a deposition material passes. The space S may have an area corresponding to the display device 10 described above with reference to FIG. 1. The display device 10 may be formed by forming a plurality of display devices on a mother substrate and separating them by a scribing process or the like. The space S shown in FIG. 3 may correspond to the display device 10.

As described above with reference to FIG. 1, the display device 10 may include the transmissive area OA. The transmissive area OA is an area through which light or sound is transmitted. The intermediate layer 22 (of FIG. 2) is not deposited in the transmissive area OA. To this end, the mask plate 130 may include a protruding portion 133 corresponding to the transmissive area OA.

Referring to FIGS. 3 and 4A, the mask plate 130 may include a body portion 131 extending in the Y direction, a recessed area 132 on one side of the body portion 131, and the protruding portion 133 protruding from the one side of the body portion 131.

The body portion 131 may be a covering portion for blocking the passage of the deposition material through the holes 121 of the mask sheet 120 where the body portion 131 is located. The body portion 131 may include a first sub-body portion 131-1 having a rectangular shape with a straight edge and a second sub-body portion 131-2 protruding from the first sub- body portion 131-1 and having a rounded edge. Recessed areas 132 may be formed on one or both sides of the body portion 131-1 between multiple sub-body portions 131-2. The rounded edge of the second sub-body portion 131-2 may be smoothly connected to the edge of the first sub-body portion 131-1. The rounded edge of the second sub-body portion 131-2 may correspond to a rounded corner in the display area DA described with reference to FIG. 1. As another embodiment, when the corner of the display area DA of a display device 10 to be formed is not rounded, for example, when the corner is at a right angle, the body portion 131 may include only the first sub-body portion 131-1.

The protruding portion 133 may protrude from the body portion 131. The protruding portion 133 may correspond to the transmissive area OA described with reference to FIG. 1. The protruding portion 133 may have a size greater than the transmissive area OA of the display area DA. FIG. 3 shows that the protruding portion 133 is substantially circular, but in some implementations, the protruding portion 133 may have an elliptical shape or a variety of planar shapes such as a polygonal shape.

The space S between the adjacent mask plates 130 is an opening portion through which the deposition material described above with reference to FIG. 3 transmits. The mask plates 130 may define a boundary of the space S.

Referring to FIGS. 3 and 4B, the mask plate 130 may cover some of the plurality of holes 121 of the mask sheet 120. First holes 121A of the plurality of holes 121 may not be covered by the mask plate 130 while the mask plate 130 and the mask sheet 120 overlap each other. However, second holes 121B may be completely covered by the mask plate 130 and third holes 121C may be partially covered by the mask plate 130.

A first deposition layer, for example, the emission layer 22B that is a portion of the intermediate layer 22, may be deposited using the first mask assembly 100. In the deposition process, the mask plate 130 and the mask sheet 120 may overlap each other and a relative position therebetween may be fixed. For example, the mask plate 130 and the mask sheet 120 may be fixed through a process such as welding.

FIGS. 3, 4A, and 4B illustrate that the protruding portion 133 protrudes from a linear region of the edge of the body portion 131. In some implementations, the protruding portion 133 may protrude from a curved area of the edge of the body portion 131, as shown in FIG. 4C. In this case, the transmissive area OA of the display device 10 (of FIG. 1) may be in contact with a corner edge of the display area DA.

The protruding portion 133 may have various shapes. For example, as shown in FIGS. 3, 4A, and 4B, the protruding portion 133 may be substantially circular. In some implementations, the protruding portion 133 may have a semi-elliptical shape, as shown in FIG. 4D. In some implementations, the protruding portion 133 may have a rectangular shape with rounded corners or may have a polygonal or irregular shape.

Figure 5:
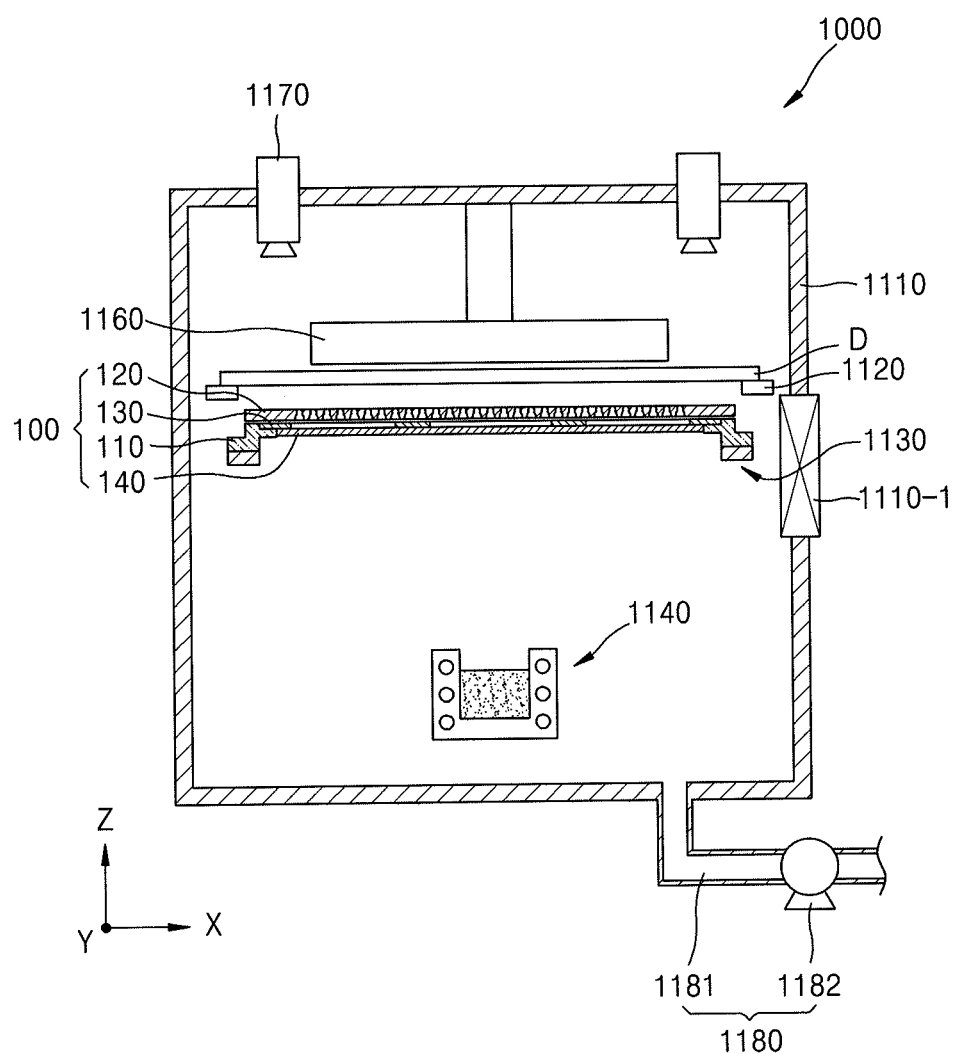
FIG. 5 illustrates a cross-sectional view of a first manufacturing device used in a manufacturing process of a display device according to an embodiment.

FIG. 5 illustrates a cross-sectional view of a first manufacturing device 1000 that may be used in a manufacturing process of a display device according to an embodiment.

Referring to FIG. 5, the first manufacturing device 1000 may include a chamber 1110, a first supporting portion 1120, a second supporting portion 1130, a source portion 1140, a magnetic force portion 1160, a vision portion 1170, and a pressure regulator 1180.

The chamber 1110 may include a space therein. One side of the chamber 1110 may be opened and a gate valve 1110-1 may be installed in the open area. The one side of the chamber 1110 may be opened or closed by an operation of the gate valve 1110-1.

The pixel circuit substrate D may be on the first supporting portion 1120. The pixel circuit substrate D shown in FIG. 5 may be a substrate including the thin-film transistor TFT on the substrate 11 and the pixel electrode 21 connected to the thin-film transistor TFT as described above with reference to FIG. 2.

The first supporting portion 1120 may support the pixel circuit substrate D. In an embodiment, the first supporting portion 1120 may be a bracket type fixed in the chamber 1110. In another embodiment, the first supporting portion 1120 may be a shuttle type that is linearly movable within the chamber 1110. Hereinafter, for convenience of explanation, it is assumed that the first supporting portion 1120 is a bracket type fixed in the chamber 1110.

The first mask assembly 100 may be on the second supporting portion 1130 in the chamber 1110. The second supporting portion 1130 may finely adjust a position of the first mask assembly 100. The second supporting portion 1130 may include a driving unit or an aligning unit for moving the first mask assembly 100.

The source portion 1140 may be located to face the first mask assembly 100. The source portion 1140 includes a deposition material. The source portion 1140 may evaporate or sublimate the deposition material by applying heat to the deposition material.

The magnetic force portion 1160 may be in the chamber 1110 to face the pixel circuit substrate D. The magnetic force portion 1160 may be on the opposite side of the source portion 1140 with the pixel circuit substrate D therebetween. The magnetic force portion 1160 may apply a magnetic force to the mask sheet 120 (see FIG. 3) of the first mask assembly 100. The magnetic force portion 1160 may prevent the mask sheet 120 (of FIG. 3) from sagging, so that the mask sheet 120 remains adjacent to the pixel circuit substrate D. The magnetic force portion 1160 may maintain a uniform gap between the mask sheet 120 and the pixel circuit substrate D uniform.

The vision portion 1170 may be installed in the chamber 1110. The vision portion 1170 may photograph positions of the pixel circuit substrate D and the first mask assembly 100. The vision portion 1170 may include a camera for photographing the pixel circuit substrate D and the first mask assembly 100. The position of the pixel circuit substrate D and the first mask assembly 100 may be detected based on an image photographed by the vision portion 1170. The second supporting portion 1130 may finely adjust the position of the first mask assembly 100 based on the detected position information.

The pressure regulator 1180 may be connected to the chamber 1110. The pressure regulator 1180 may adjust pressure inside the chamber 1110. For example, the pressure regulator 1180 may adjust the pressure inside the chamber 1110 to be equal to or similar to atmospheric pressure. In some implementations, the pressure regulator 1180 may adjust the pressure inside the chamber 1110 to be the same as or similar to a vacuum state.

The pressure regulator 1180 may include a connection pipe 1181 connected to the chamber 1110 and a pump 1182 installed in the connection pipe 1181. According to an operation of the pump 1182, outside air may be introduced through the connection pipe 1181 or gas inside the chamber 1110 may be guided to the outside.

A sub-layer of an intermediate layer of the display device 10 described with reference to FIG. 2, for example, the emission layer 22B, may be formed in the first manufacturing device 1000.

The first mask assembly 100 and the pixel circuit substrate D may be arranged inside the chamber 1110.

For example, when the pressure regulator 1180 regulates the pressure inside the chamber 1110 to be the same as or similar to the atmospheric pressure, the gate valve 1110-1 may operate to open the chamber 1110. Thereafter, the pixel circuit substrate D may be charged into the chamber 1110. The pixel circuit substrate D may be charged into the chamber 1110 in various ways. For example, the pixel circuit substrate D may be charged into the chamber 1110 from outside the chamber 1110 by a robot arm or the like outside the chamber 1110. In another embodiment, when the first supporting portion 1120 is formed in a shuttle shape, the supporting portion 1120 with the pixel circuit substrate D thereon may be carried out of the chamber 1110 or into the chamber 1110 by a separate robot arm or the like outside the chamber 1110, and the first supporting portion 1120 is charged into the chamber 1110 from the outside of the chamber 1110.

The first mask assembly 100 may be arranged in the chamber 1110. In another embodiment, the first mask assembly 100 may be charged into the chamber 1110 from the outside of the chamber 1110 in the same manner as the pixel circuit substrate D.

The pixel circuit substrate D may be on the first supporting portion 1120. The vision portion 1170 may photograph the position of the pixel circuit substrate D and the first mask assembly 100. For example, the vision portion 1170 may photograph a first alignment mark formed on the pixel circuit substrate D and a second alignment mark of the first mask assembly 100. The positions of the pixel circuit substrate D and the first mask assembly 100 may be obtained based on photographic detection of the first alignment mark and the second alignment mark.

When the positions of the pixel circuit substrate D and the first mask assembly 100 are obtained, the second supporting portion 1130 may finely adjust the position of the first mask assembly 100.

Thereafter, a deposition material may be supplied to the first mask assembly 100 according to an operation of the source portion 1140. The deposition material may pass through the plurality of holes 121 provided in the mask sheet 120 of the first mask assembly 100 described with reference to FIG. 3, or the like. The deposition material that has passed through the plurality of holes 121 may be deposited on the pixel circuit substrate D. The deposition material may be, for example, a material constituting the emission layer 22B (of FIG. 2), as described above. During the deposition process, the pump 1182 may exhaust gas inside the chamber 1110 to the outside, thereby keeping the pressure inside the chamber 1110 the same as, or similar to, a vacuum state.

Figure 6:
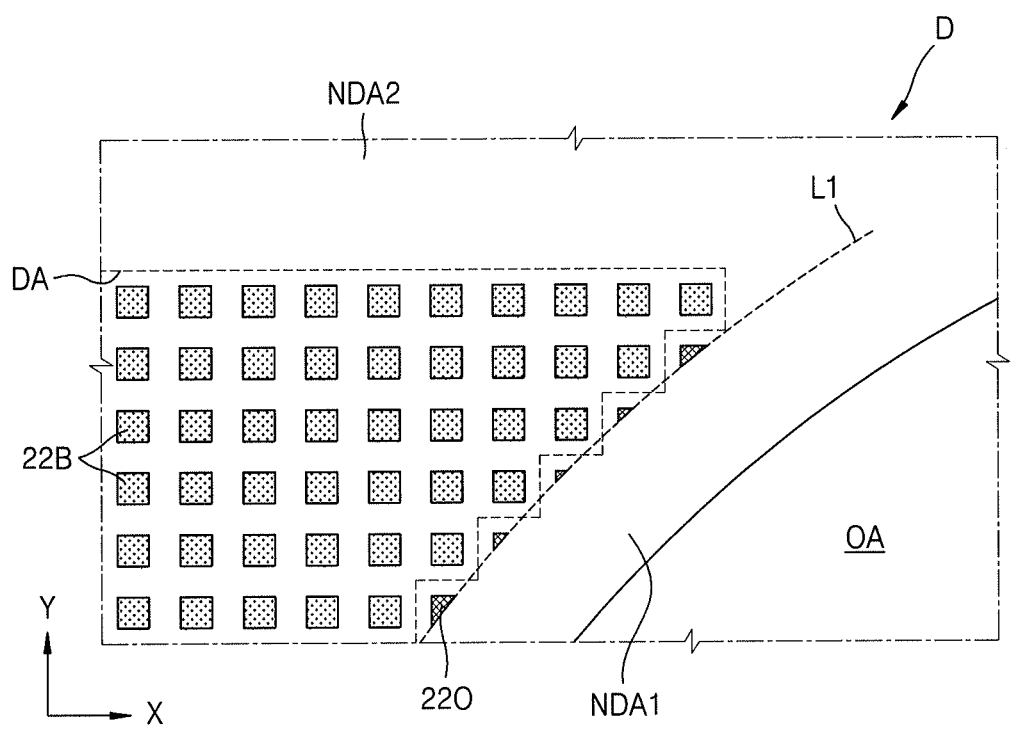
FIG. 6 illustrates a plan view of a portion of a pixel circuit substrate including a first deposition layer.

FIG. 6 illustrates a plan view of a portion of a pixel circuit substrate including a first deposition layer (e.g., an emission layer) formed using the first manufacturing device described with reference to FIG. 5. Hereinafter, a case where the first deposition layer is an emission layer will be mainly described. In some implementations, the first deposition layer formed using a first mask assembly may be any one of first and second common layers.

Referring to FIG. 6, the first deposition layer, for example, emission layers 22B, may be formed on the pixel circuit substrate D. The emission layers 22B may be arranged to be spaced apart from each other in the display area DA to correspond to respective pixels. The emission layers 22B in the display area DA may include deposition materials that have passed through the first holes 121A of the mask sheet 120 not covered by the mask plate 130 among openings of the mask sheet 120 described above with reference to FIG. 4B.

The transmissive area OA may be a portion where the protruding portion 133 of the mask plate 130 overlaps and covers the mask sheet 120. The first deposition layer, for example, the emission layers 22B, is not formed therein.

A first dummy deposition layer, for example, dummy emission layers 22O, may be formed around the display area DA, for example, in the first non-display area NDA1. The dummy emission layers 22O may be layers corresponding to dummy pixels that do not emit light. The dummy emission layers 22O and the emission layers 22B may be formed during a process that forms the first deposition layer. The first deposition layer may include first emission layers (e.g., emission layers 22B) and second emission layers (e.g., dummy emission layers 22O). Thus, the material of the dummy emission layer 22O may be the same as the material of the emission layer 22B formed in the display area DA while the area and/or shape of the dummy emission layer 22O is different from the area and/or shape of the emission layer 22B formed in the display area DA. For example, the area of the dummy emission layer 22O may be less than the area of the emission layer 22B formed in the display area DA. The dummy emission layer 22O may include deposition materials that have passed through the third holes 121C partially covered by the mask plate 130 among the openings of the mask sheet 120 described above with reference to FIG. 4B. A virtual line L1 connecting respective edges of the dummy emission layers 22O may correspond to an edge of the protruding portion 133 described above with reference to FIGS. 3 and 4A.

Figure 7:
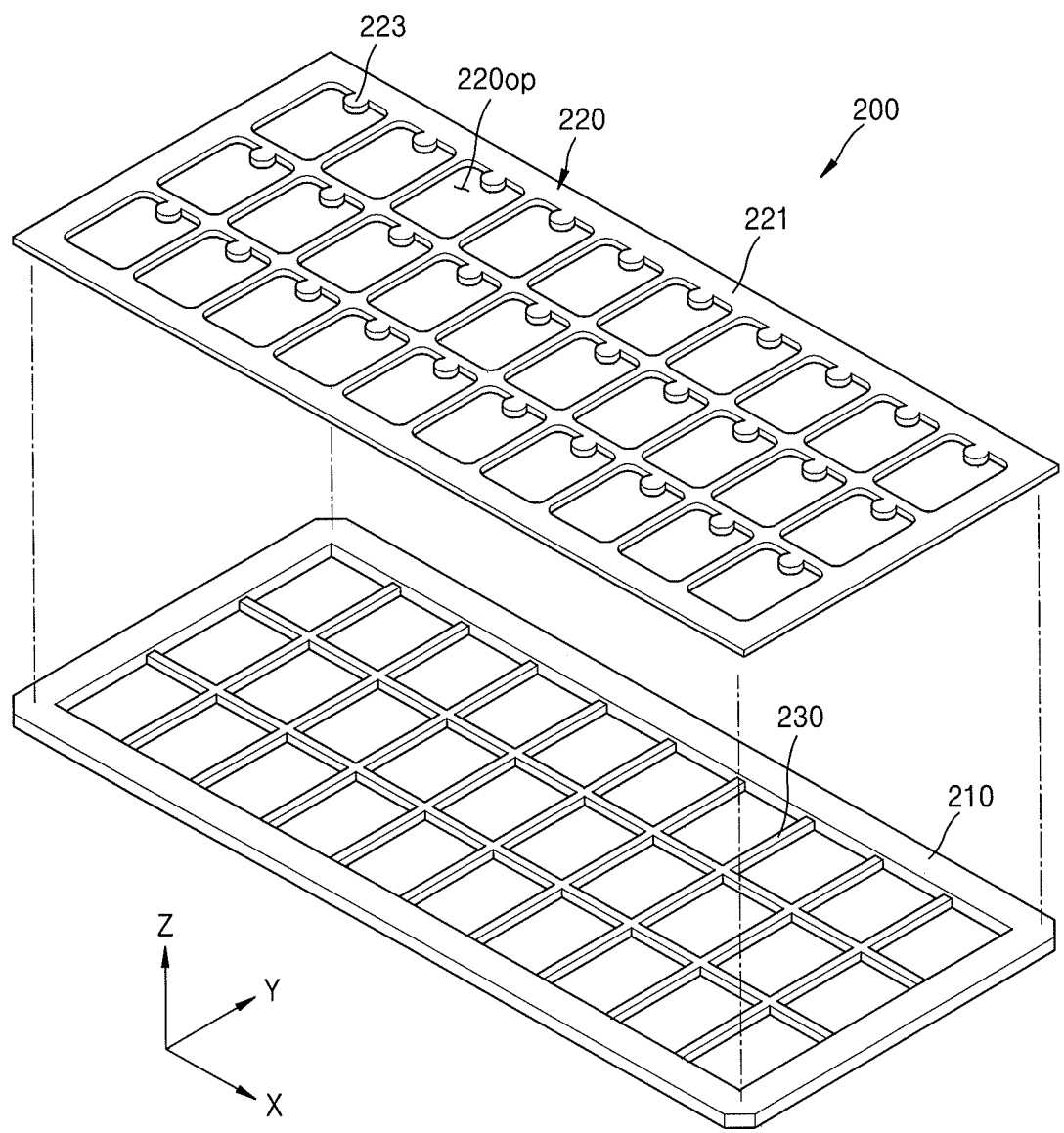
FIG. 7 illustrates a perspective view of a second mask assembly for forming a second deposition layer of a display device according to an embodiment.
Figure 8:
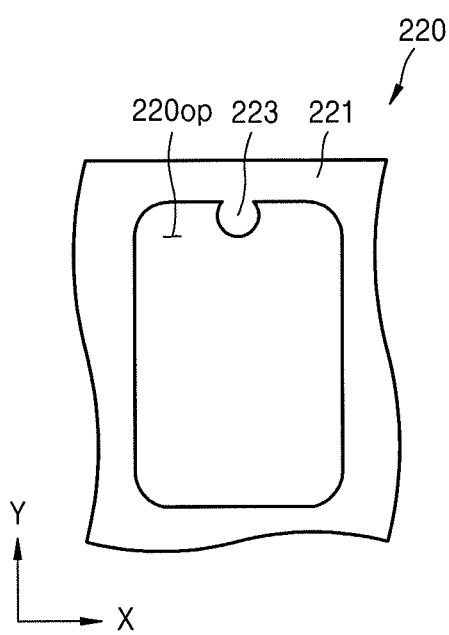
FIG. 8 illustrates a plan view of an opening of the second mask assembly of FIG. 7.

FIG. 7 illustrates a perspective view of a second mask assembly for forming a second deposition layer of a display device according to an embodiment, and FIG. 8 illustrates a plan view of an opening of the second mask assembly of FIG. 7.

Referring to FIGS. 7 and 8, a second mask assembly 200 may include a mask frame 210, a mask plate 220, and a support frame 230. The mask frame 210 may have a shape of a square ring or a frame. The support frame 230 may be installed in the mask frame 210 as a lattice-shaped rib. For example, the support frame 230 may be manufactured separately from the mask frame 210 and then coupled to the mask frame 210. In some implementations, the support frame 230 may be integrally formed with the mask frame 210. The support frame 230 may partition an inner space of the mask frame 210 through the rib and may support the mask plate 220.

The mask plate 220 may include opening portions 220op. An opening portion 220op, which is a portion through which a deposition material passes, may be surrounded by a body portion 221 defining the opening 220op. The body portion 221 may be a covering portion for covering or blocking the passage of the deposition material. The opening 220op may have an edge of a closed curve as a whole by the body portion 221.

The mask plate 220 may include a protruding portion 223 protruding from the body portion 221 toward the center region of the opening portion 220op. The protruding portion 223 may correspond to the transmissive area OA of the display device 10 described above with reference to FIG. 1.

The protruding portion 223 may be formed to be larger than the transmissive area OA. The protruding portion 223 contacting an edge of the body portion 221 may be formed integrally with the body portion 221. An edge of the protruding portion 223 may be integrally connected with the edge of the body portion 221 to form a boundary, for example, the edge of the opening portion 220op. A shape of the opening 220op may correspond to the display area DA of the display device 10 described above with reference to FIG. 1.

The shape and position of the protruding portion 223 may correspond to the shape and position of the protruding portion 133 of the first mask assembly 100 described above with reference to FIG. 3, respectively. For example, the protruding portion 223 may be in a position corresponding to the protruding portion 133 described above with reference to FIGS. 3 and 4A. In another embodiment, when the protruding portion 133 of the first mask assembly 100 is formed in a position as shown in FIG. 4C, the protruding portion 223 of the second mask assembly 200 may also be formed in a position corresponding to the position of the protruding portion 133 described with reference to FIG. 4C. In another embodiment, when the protruding portion 133 of the first mask assembly 100 has a shape described with reference to FIG. 4D, the protruding portion 223 of the second mask assembly 200 may also have a shape described with reference to FIG. 4D.

Figure 9:
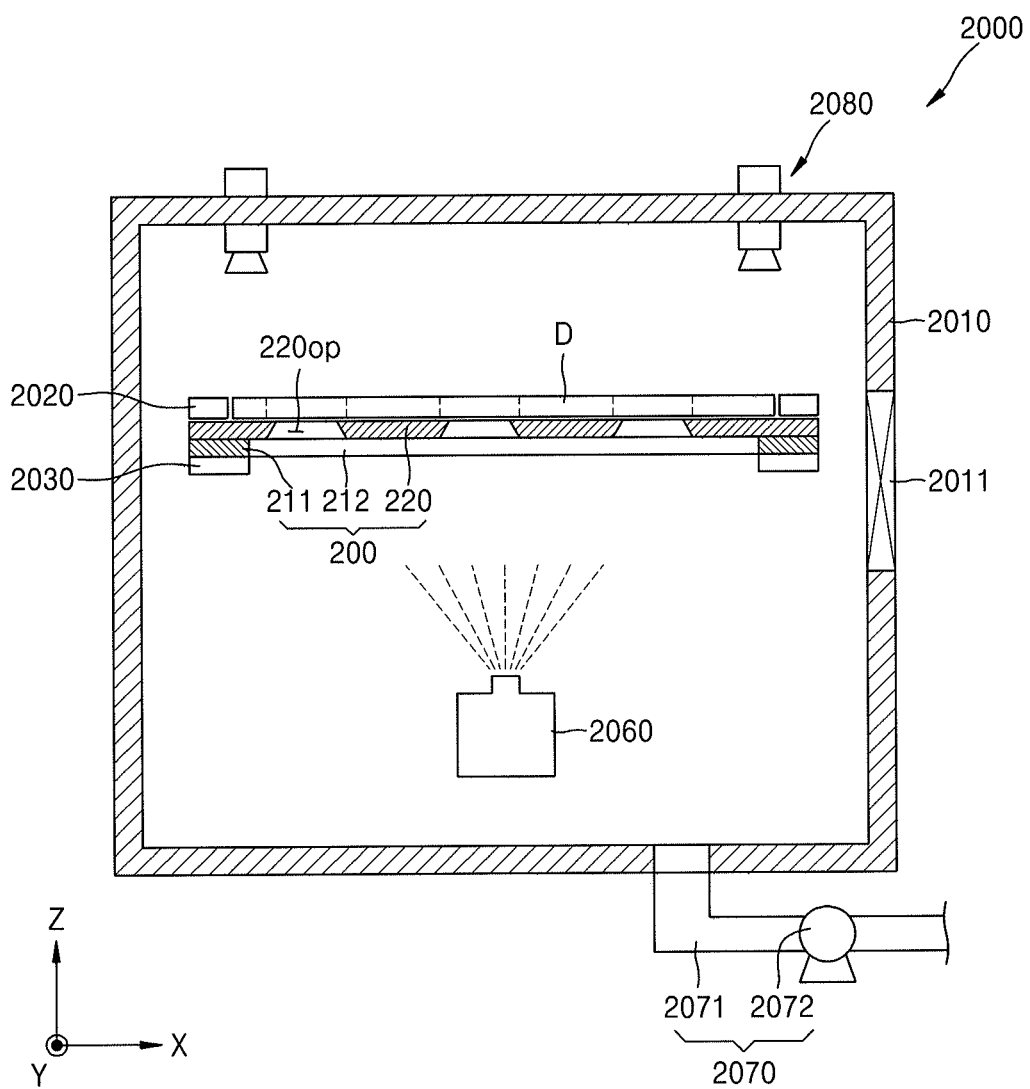
FIG. 9 illustrates a cross-sectional view of a second manufacturing device used in a manufacturing process of a display device according to an embodiment.

FIG. 9 illustrates a cross-sectional view of a second manufacturing device that may be used in a manufacturing process of a display device according to an embodiment.

Referring to FIG. 9, a second manufacturing device 2000 may include a chamber 2010, a third supporting portion 2020, a fourth supporting portion 2030, a source portion 2060, a pressure regulator 2070, and a vision portion 2080.

The chamber 2010 may include a space therein. One side of the chamber 2010 may be opened. A gate valve 2011 may be arranged in the open area to shield or close the open area.

The third supporting portion 2020 may be in the chamber 2010 to support the pixel circuit substrate D. In an embodiment, the third supporting portion 2020 may be fixed in the chamber 2010 and the pixel circuit substrate D may be above the third supporting portion 2020. In another embodiment, the third supporting portion 2020 may be in the form of a shuttle that is linearly movable within the chamber 2010. In another embodiment, the third supporting portion 2020 may be in the form of a clamp that is arranged inside the chamber 2010 and that holds the pixel circuit substrate D. In some implementations, the third supporting portion 2020 may include an electrostatic chuck or an adhesive chuck for fixing the pixel circuit substrate D in the chamber 2010.

The second mask assembly 200 may be in the fourth supporting portion 2030. The fourth supporting portion 2030 may adjust a position of the second mask assembly 200. For example, the fourth supporting portion 2030 may elevate or lower the second mask assembly 200 by a certain distance, rotate the second mask assembly 200, or linearly move the second mask assembly 200 in one direction.

The source portion 2060 may include a deposition material. The source portion 2060 may sublimate or vaporize the deposition material. The source portion 2060 may include a heater for applying heat to the deposition material. The source portion 2060 may include a crucible for accommodating the deposition material. During the deposition process, the source portion 2060 may remain stationary in a certain position within the chamber 2010. In some implementations, the source portion 2060 may linearly move and reciprocate in one direction within the chamber 2010 during the deposition process.

The pressure regulator 2070 may be connected to the chamber 2010. The pressure regulator 2070 may adjust pressure inside the chamber 2010. The pressure regulator 2070 may include a guide pipe 2071 connected to the chamber 2010 and a vacuum pump 2072 installed in the guide pipe 2071 to regulate pressure inside the chamber 2010. Gas inside the chamber 2010 may be exhausted to the outside or gas may be supplied toward the inside of the chamber 2010 according to an operation of the vacuum pump 2072.

The vision portion 2080 may photograph the pixel circuit substrate D and the second mask assembly 200 in the chamber 2010. The pixel circuit substrate D and the second mask assembly 200 may be aligned based on an image photographed by the vision portion 2080.

A sub-layer of the intermediate layer of the display device 10 described above with reference to FIG. 2, for example, the first common layer 22A and/or the second common layer 22C, or the opposite electrode 23, may be formed in the second manufacturing device 2000. Hereinafter, for convenience of description, a process of forming the first common layer 22A will be described.

First, the second mask assembly 200 and the pixel circuit substrate D are arranged inside the chamber 2010. When the pixel circuit substrate D and the second mask assembly 200 are arranged, a first alignment mark of the pixel circuit substrate D and a third alignment mark of the second mask assembly 200 may be photographed and compared with each other through the vision portion 2080 so that the positions of the pixel circuit substrate D and the second mask assembly 200 may be adjusted. The fourth supporting portion 2030 may finely adjust the position of the second mask assembly 200.

Thereafter, the source portion 2060 may operate to supply the deposition material to the pixel circuit substrate D. The deposition material may pass through the opening 220op described above with reference to FIGS. 7 and 8. The deposition material that has passed through the opening 220op may be deposited on the pixel circuit substrate D. In an embodiment, during the deposition process, the pump 2072 may exhaust gas inside the chamber 2010 to the outside, thereby keeping the pressure inside the chamber 2010 the same or similar to a vacuum state.

Figure 10:
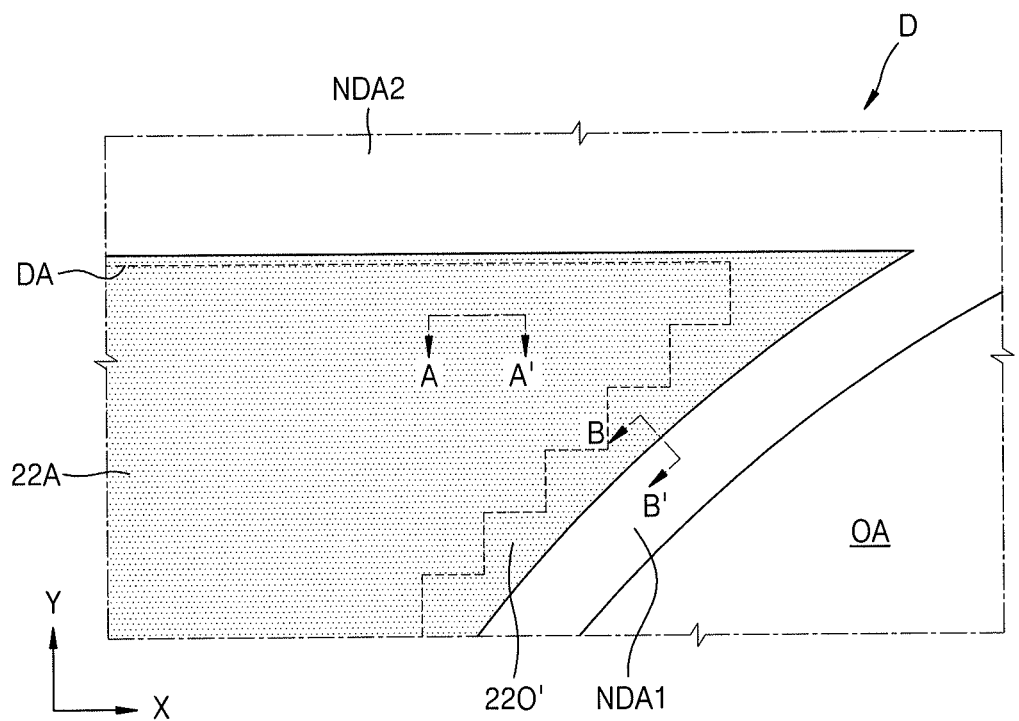
FIG. 10 illustrates a plan view of a portion of a pixel circuit substrate including a second deposition layer.
Figure 11:
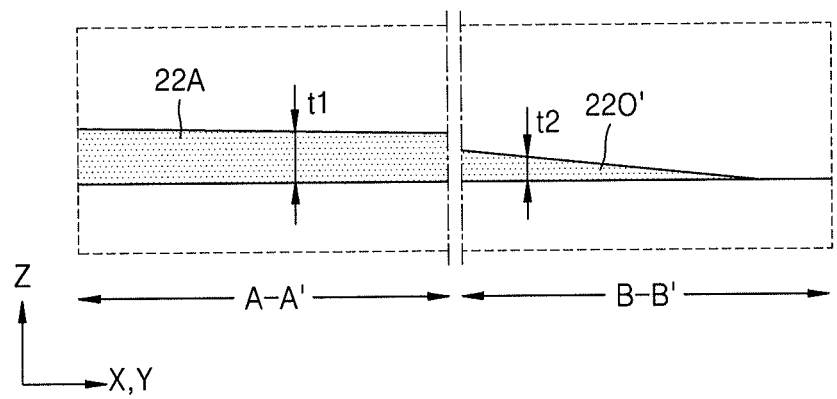
FIG. 11 illustrates cross-sectional views taken along line A-A' and line B-B' in FIG. 10.

FIG. 10 illustrates a plan view of a portion of a pixel circuit substrate including a second deposition layer (e.g., a first common layer, a second common layer, and/or an opposite electrode) formed using the second manufacturing device described above with reference to FIG. 9. FIG. 11 illustrates a cross-sectional view taken along line A-A' and line B-B' in FIG. 10. Hereinafter, a case where the second deposition layer is the first common layer will be mainly described. However, in other embodiments, the first deposition layer formed using the first mask assembly may be the second common layer and/or the opposite electrode.

Referring to FIGS. 10 and 11, the second deposition layer, for example, the first common layer 22A, may be formed on the pixel circuit substrate D. The first common layer 22A may be formed as a single body so as to cover the display area DA as a whole. The transmissive area OA is a portion where the protruding portion 133 of the mask plate 130 is overlaps and covers the mask plate so that the second deposition layer, for example, the first common layer 22A, is not formed therein.

In the deposition process described above with reference to FIG. 9, the mask plate 220 may be arranged so as to face an upper surface of the pixel electrode 21 and the pixel-defining layer 19 with a certain gap therebetween. The protruding portion 223 of the mask plate 220 may cover the transmissive area OA and the first non-display area NDA1 with a size greater than the transmissive area OA. However, when the deposition process is performed with the protruding portion 223 spaced apart from the pixel-defining layer 19 by a certain distance so as to have a gap with the upper surface of the pixel-defining layer 19, a deposition material advancing obliquely with respect to a direction toward the upper surface of the pixel-defining layer 19 may be partially deposited in a region immediately below the protruding portion 223 in a region on the pixel circuit substrate D. In this regard, FIG. 10 shows an edge portion 22O' extending to the first non-display area NDA1 through the display area DA. A portion of the first common layer 22A that is located in the first non-display area NDA1, for example, the edge portion 22O' of the first common layer 22A that is adjacent to an edge of the transmissive area OA, may have a thickness that is different from the thickness of a portion of the first common layer 22A that is located in the display area DA.

For example, as shown in FIG. 11, a thickness t2 of the edge portion 22O' in the first common layer 22A may be equal to a thickness t2 of the portion of the first common layer 22A that is located in the display area DA, and the thickness t2 of the edge portion 22O' may gradually decrease in a direction toward the transmissive area OA.

By way of summation and review, a display device that has a transmissive area through which light or sound is transmitted while the area of a display area is enlarged is being developed. When an organic material or the like is deposited in the transmissive area, a layer of the organic material or the like may be damaged during a process such as formation of an opening through the transmissive area, or a foreign substance may pass through the layer to a light-emitting element of a pixel. Meanwhile, even if an opening is not formed through the transmissive area, there is a risk that the layer of the organic material or the like may be deposited on the transmissive area and may lower transmittance in the transmissive area.

According to one or more embodiments, a method of manufacturing an organic light-emitting display and a mask assembly may prevent a deposition layer from being formed on a portion corresponding to a transmissive area or on an opening. The possibility that a foreign substance could progress to a pixel of a display area or to transmissive area such that transmittance decreases may be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A method of manufacturing a display device, the method comprising:
preparing a pixel circuit substrate including thin-film transistors and pixel electrodes respectively electrically connected to the thin-film transistors;
forming a first deposition layer on the pixel circuit substrate using a first mask assembly; and
forming a second deposition layer on the pixel circuit substrate using a second mask assembly,
wherein:
at least one of the first mask assembly and the second mask assembly includes a mask plate including an opening portion through which a deposition material passes and a covering portion that blocks a passage of the deposition material, and
the mask plate includes a protruding portion that protrudes from an edge of the covering portion toward a center region of the opening portion.

2. The method as claimed in claim 1, wherein:
the first mask assembly includes the mask plate and a mask sheet including a plurality of holes spaced apart from each other, and
the mask plate of the first mask assembly partially covers a first hole among the plurality of holes.

3. The method as claimed in claim 2, wherein the mask plate of the first mask assembly overlaps the mask sheet and extends in a direction intersecting an extending direction of the mask sheet.

4. The method as claimed in claim 1, wherein:
the first deposition layer includes emission layers spaced apart from each other, and
a shape of each of first emission layers among the emission layers formed on the pixel circuit substrate is different from a shape of each of second emission layers among the emission layers.

5. The method as claimed in claim 4, wherein:
the display device includes a transmissive area through which light or sound is transmitted, a display area that partially surrounds the transmissive area, and a non-display area between the transmissive area and the display area, and
the first emission layers correspond to the display area, and the second emission layers correspond to the non-display area.

6. The method as claimed in claim 1, wherein:
the first deposition layer includes emission layers spaced apart from each other, and
an area of each of first emission layers among the emission layers formed on the pixel circuit substrate is greater than an area of each of second emission layers among the emission layers.

7. The method as claimed in claim 1, wherein:
the second mask assembly includes the mask plate,
the mask plate of the second mask assembly includes an opening portion having a closed loop edge, and
an edge of the protruding portion corresponds to a portion of the closed loop edge.

8. The method as claimed in claim 7, wherein:
the second deposition layer includes at least one of a hole transport layer, a hole injection layer, an electron transport layer, an electron injection layer, and an opposite electrode having a polarity different from that of the pixel electrodes, and
a thickness of a first portion of the second deposition layer formed on the pixel circuit substrate is greater than a thickness of a second portion of the second deposition layer.

9. The method as claimed in claim 8, wherein:
the display device includes a transmissive area through which light or sound is transmitted, a display area that partially surrounds the transmissive area, and a non-display area between the transmissive area and the display area, and
ytthe first portion of the second deposition layer corresponds to the display area, and the second portion of the second deposition layer corresponds to the non-display area.

10. The method as claimed in claim 9, wherein the second deposition layer is not on the transmissive area.

11. A mask assembly comprising:
a mask plate including:
an opening portion that through which a deposition material passes,
a non-closed loop covering portion that blocks a passage of the deposition material, the covering portion including a rectangular first sub-body portion and multiple second sub-body portions extending from the first sub-body portion that together form a recessed area directly connected to and facing the opening portion through which the deposition material passes, and
a protruding portion in the recessed area, the protruding portion protruding from an edge of the covering portion toward a center region of the opening portion.

12. The mask assembly as claimed in claim 11, wherein:
the edge of the covering portion includes a linear region, and
the protruding portion protrudes from the linear region.

13. The mask assembly as claimed in claim 11, wherein:
the edge of the covering portion includes a curved area, and
the protruding portion protrudes from the curved area.

14. The mask assembly as claimed in claim 11, wherein the covering portion and the protruding portion are integrally formed.

15. A mask assembly comprising:
a mask plate including:
an opening portion through which a deposition material passes,
a covering portion that blocks a passage of the deposition material, and
a protruding portion protruding from an edge of the covering portion toward a center region of the opening portion; and
a mask sheet overlapping the mask plate, the mask sheet including a plurality of holes spaced apart from each other.

16. The mask assembly as claimed in claim 15, wherein the protruding portion of the mask plate partially covers the holes of the mask sheet.

17. The mask assembly as claimed in claim 16, wherein the protruding portion of the mask plate partially covers a first hole among the holes of the mask sheet.

18. The mask assembly as claimed in claim 15, wherein the mask sheet and the mask plate overlap each other while contacting each other.

19. The mask assembly as claimed in claim 15, wherein the mask sheet and the mask plate are made of different materials.

20. The mask assembly as claimed in claim 11, wherein each of the multiple second sub-body portions includes:
a straight edge facing away from the first sub-body portion, and a rounded edge smoothly connected to the edge of the first sub-body portion.

* * * * *